US007428310B2

(12) United States Patent
Park

(10) Patent No.: US 7,428,310 B2
(45) Date of Patent: Sep. 23, 2008

(54) AUDIO OUTPUT ADJUSTING DEVICE OF HOME THEATER SYSTEM AND METHOD THEREOF

(75) Inventor: Jeong-Hyun Park, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 758 days.

(21) Appl. No.: 10/740,549

(22) Filed: Dec. 22, 2003

(65) Prior Publication Data

US 2004/0131207 A1 Jul. 8, 2004

(30) Foreign Application Priority Data

Dec. 31, 2002 (KR) ..................... 10-2002-0088368

(51) Int. Cl.
*H03G 3/00* (2006.01)

(52) U.S. Cl. .......................... 381/104; 381/58; 381/56; 381/105; 381/107

(58) Field of Classification Search ............ 381/56–57, 381/104–105, 107–108, 109–110, 61, 58–59, 381/300, 303, 306–307
See application file for complete search history.

(56) References Cited

U.S. PATENT DOCUMENTS 5,386,478 A * 1/1995 Plunkett .................... 381/103
6,069,567 A * 5/2000 Zawilski ................ 340/825.22
6,111,957 A * 8/2000 Thomasson .................. 381/15
6,118,880 A * 9/2000 Kokkosoulis et al. ....... 381/303
6,798,889 B1 * 9/2004 Dicker et al. ............... 381/303
6,954,538 B2 * 10/2005 Shiraishi ..................... 381/105
7,123,731 B2 * 10/2006 Cohen et al. ................ 381/303
2002/0136414 A1 * 9/2002 Jordan et al. .................. 381/58
2002/0181713 A1 * 12/2002 Kato et al. ..................... 381/56
2004/0071294 A1 * 4/2004 Halgas et al. ................. 381/59

FOREIGN PATENT DOCUMENTS

WO WO 02/078396 A2 10/2002

* cited by examiner

*Primary Examiner*—Vivian Chin
*Assistant Examiner*—Disler Paul
(74) *Attorney, Agent, or Firm*—Ked & Associates LLP

(57) ABSTRACT

A home theater system, an audio output adjusting device of a home theater system and methods thereof allow a prescribed or three-dimension audio configuration state for at least one prescribed position even when the prescribed location and/or a configuration of the speakers in a home theater system are modified. The device can include a checker for analyzing at least one of volume and delay time of a test audio signal outputted from speakers and providing the analyzed information to a controller. The controller can control output level and timing of audio signals subsequently output from the speakers based on the analyzed information.

23 Claims, 4 Drawing Sheets

AUDIO OUTPUT ADJUSTING DEVICE OF HOME THEATER SYSTEM AND METHOD THEREOF

BACKGROUND OF THE INVENTION

1. Field of the Invention

The present invention relates to home theater systems and methods, and more particularly, to audio output adjusting methods of a home theater system and devices thereof.

2. Description of the Conventional Art

A home theater system refers to a theater system that is transferred to a room in a home so a user can enjoy programs at home. The home theater system is constituted with an image device such as a projector, a projection (e.g., a large screen TV), a plasma display panel (PDP), and a digital/general TV, an amplifier provided with a basic 5.1 channel, a digital theater system such as a dolby digital, etc., and a speaker system of 5.1 channel (front (L/R), rear (L/R), center, active sub woofer). The home theater system includes a DVD player, and clear images of the home theater system can be seen at home through a screen or TV media. Also, the home theater system reproduces grandeur and sound that can be appreciated as in a theater.

The home theater system can implement a clean high picture quality on a screen and can reproduce three-dimensional sound by reproducing 2 channel stereo sound into 5.1 channel like a VCR and a TV broadcasting since dolby prologic technique or the like is applied thereto.

Generally, in the home theater system, a place where the home theater system will be installed and a region where a user will be positioned at the installation place (e.g., a peripheral region of a sofa in a living room) are set as a base region or configuration before a product is presented out. Then, sound level and output timing of an audio signal outputted from speakers of the home theater system are set in the home theater system in order to reproduce utmost three-dimensional sound in the base region.

As described above, related art home theater systems have various disadvantages. In the related art home theater system, sound level and output timing of an audio signal are not additionally adjusted after they are set at the first stage of a product presentation. Accordingly, if a place where the home theater system will be installed and a region where a user will be positioned are subsequently changed, a prescribed audio reception or an optimum audio surround sound cannot be provided.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide an audio output adjusting device of a home theater system and a method thereof capable of controlling an output audio state for a selected position of a plurality of positions.

Another object of the present invention is to provide an audio output adjusting device of a home theater system and a method thereof capable of making a user appreciate audio in a prescribed state even if a position of speakers is changed by controlling output level and timing of an audio signal outputted from the speakers according to a position of the speakers.

To achieve at least these objects and other advantages in whole or in part and in accordance with the purpose of the present invention, as embodied and broadly described herein, there is provided an audio output adjusting device of a home theater system that includes a checker configured to receive volume and delay time of a test audio signal outputted from speakers and a controller configured to control output level and timing of a subsequent audio signal outputted from the speakers based on an analysis of the volume and delay time of the received test audio signal.

To further achieve these objects and other advantages in a whole or in part and in accordance with the purpose of the present invention, as embodied and broadly described herein, there is also provided an audio output adjusting method of a home theater system that includes outputting a test audio signal according to a request, analyzing volume level and timing of the outputted test audio signal and controlling output level and timing of subsequent audio signals outputted from speakers based on the analyzed information.

To further achieve these objects and other advantages in a whole or in part and in accordance with the purpose of the present invention, as embodied and broadly described herein, there is also provided an audio output adjusting method that includes requesting output of a prescribed test signal by output audio devices of a home entertainment system in a first configuration, wherein a configuration determines a positional relationship between the output audio devices and a prescribed location, analyzing the prescribed test signal transmitted by the output audio devices in a second configuration different than the first configuration and modifying the control of the audio signals to be subsequently output by the output audio devices according to the analyzed prescribed test signal to establish a prescribed audio state of the second configuration.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF THE PREFERRED EMBODIMENTS

Reference will now be made to embodiments of the present invention, examples of which are illustrated in the accompanying drawings. Embodiments of an audio output adjusting device and method of a home theater system are capable of controlling a prescribed or an optimum audio state when a position of speakers is changed or a desired listening position is changed by controlling output level and timing of an audio signal outputted from the speakers according to a position of the speakers will now be described.

Figure 1:
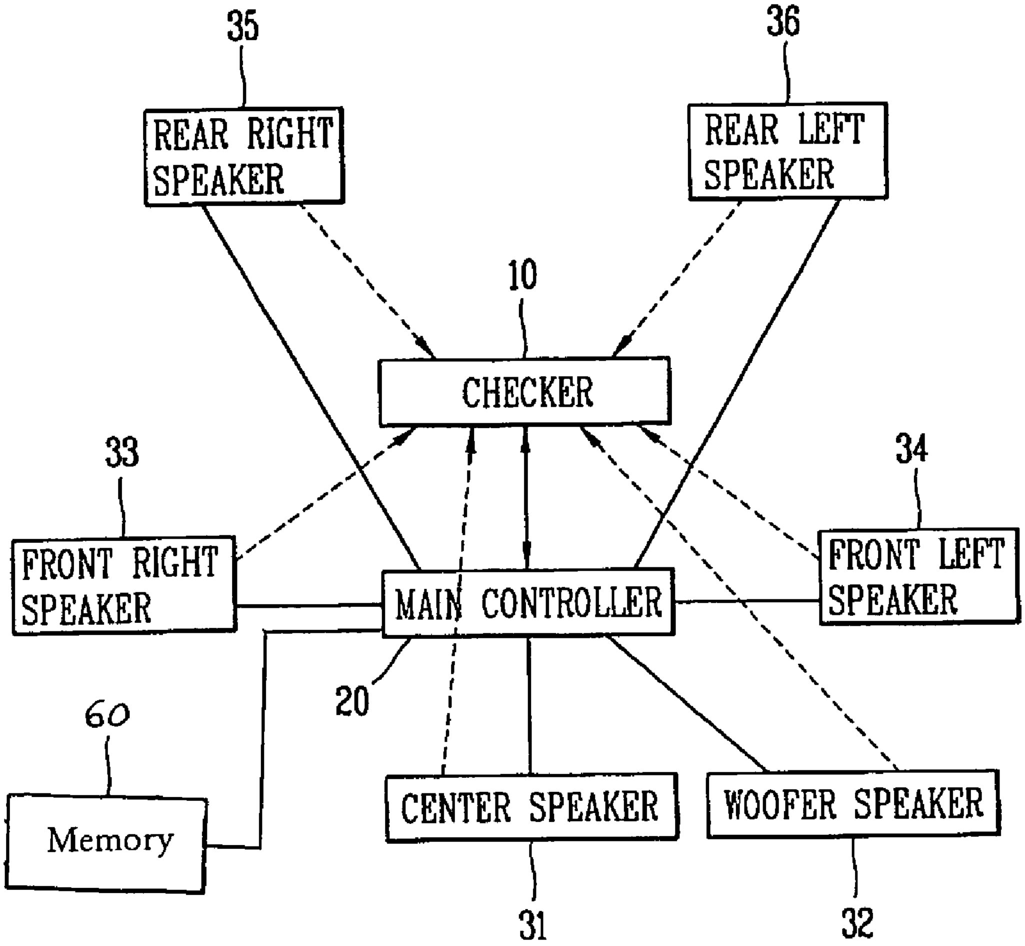
FIG. 1 is a diagram showing a preferred embodiment of an audio output adjusting device of a home theater system according to the present invention.

FIG. 1 is a diagram showing an embodiment of an audio output adjusting device of a home theater system according to the present invention. As shown in FIG. 1, an audio output adjusting device of a home theater system according to the present invention can include speakers 31, 32, 33, 34, 35, and 36 located at a user's periphery, a checker 10 and a main controller 20. The checker 10 can output a test audio signal using the speakers, analyze volume and delay time of the test audio signal outputted from the speakers, and preferably output the analyzed information to the main controller. The main controller 20 can control output level and timing of an audio signal outputted from the speakers based on the analyzed information, which can be received from the checker 10.

Operations of the audio output adjusting device of a home theater system shown in FIG. 1 will now be described. When the main controller 20 receives an audio output adjusting key signal, the main controller 20 adjusts an audio signal output. For example, the main controller 20 can output a predetermined test audio signal to the speakers 31, 32, 33, 34, 35, and 36. The test audio signal preferably denotes an audio signal having a predetermined output level in order to adjust an audio output of a home theater system, and volume level and output timing of the test audio signal are preferably set before the home theater system is presented for sale. However, the present invention is not intended to be so limited. For example, the test audio signal could be subsequently added or additional characteristics of the test audio signal could be set and/or monitored.

The speakers 31, 32, 33, 34, 35, and 36 output the inputted test audio signal, which can be received by the checker 10. The test signal can be selected from a set of various test signals or can be a plurality of signals transmitted in series for reception and analysis by the checker 10.

The checker 10 can analyze volume and delay time or the like of the inputted test audio signal and can output the analyzed information to the main controller 20. That is, the checker 10 is preferably installed or located at a position of a user, who will appreciate substantially three-dimensional (3D) audio, to analyze volume level and delay time of the test audio signal outputted from the speakers 31, 32, 33, 34, 35, and 36. It is preferable that the checker 10 is independently installed as an additional device or is added to a remote controller. However, the present invention is not intended to be so limited.

Then, the main controller 20 can adjust output level and timing of an audio signal outputted from the speakers 31, 32, 33, 34, 35, and 36 on the basis of the analyzed information. However, the present invention is not intended to be so limited. For example, the checker 10 could perform the complete analysis and output adjustments directly to the speakers or main controller. Alternatively, the checker 10 could output raw data from the received test audio signal to the main controller 20.

Figure 2:
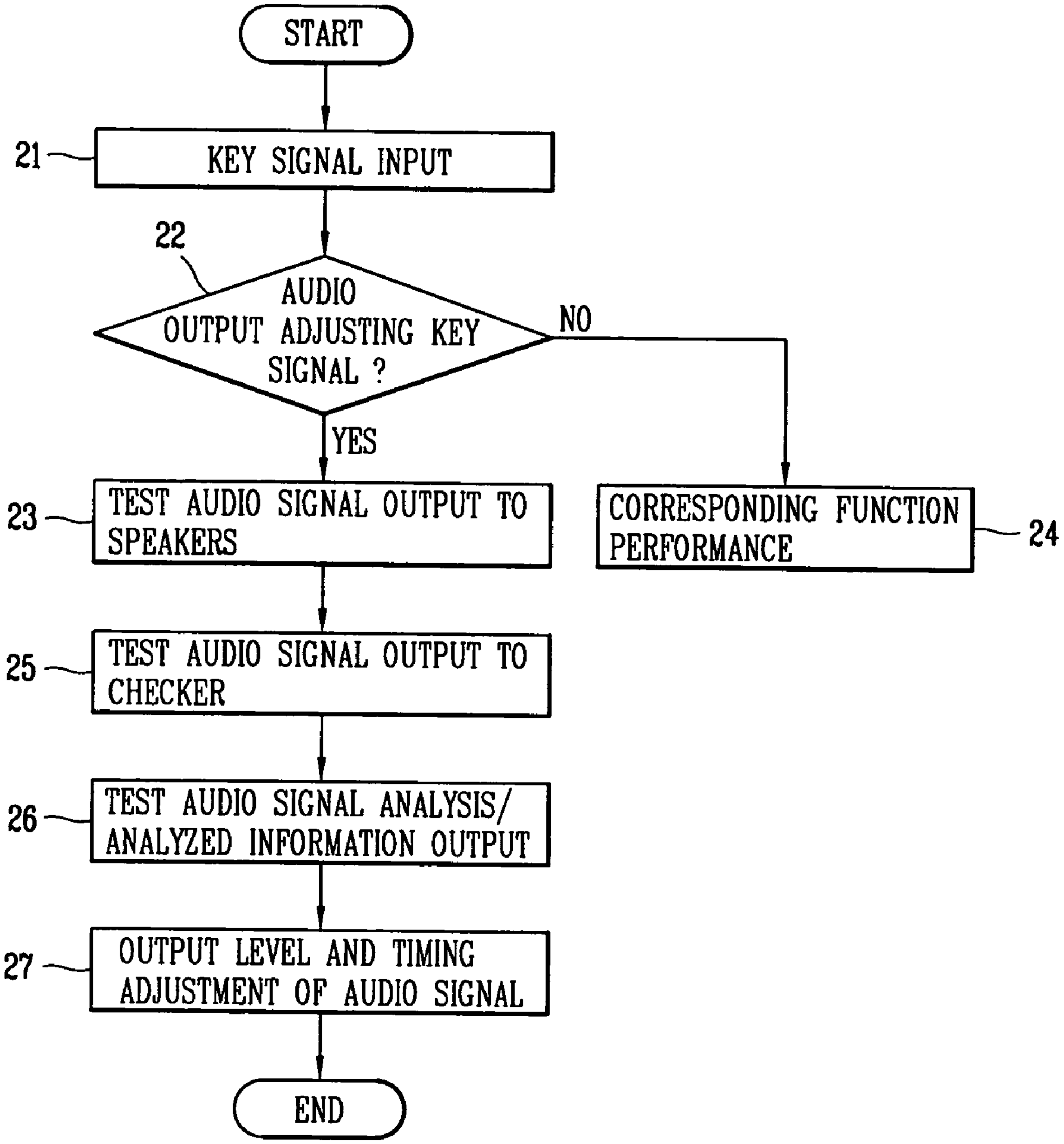
FIG. 2 is a flow chart showing a preferred embodiment of an audio output adjusting method of a home theater system according to the present invention.

FIG. 2 is a flow chart showing an embodiment of an audio output adjusting method of a home theater system according to the present invention. The embodiment of an audio output adjusting method can be applied to and will be described using the system shown in FIG. 1. However, the present invention is not intended to be so limited. As shown in FIG. 2, the audio output adjusting method of a home theater system can include sequentially outputting a test audio signal to the speakers upon request, analyzing volume and delay time of the inputted audio signal and controlling output level and timing of an audio signal outputted from the speakers based on the analyzed information.

As shown in FIG. 2, after a process starts, the user can output an audio output adjusting key signal to the main controller 20 when they desire to analyze or appreciate (e.g., listen) to audio having a prescribed or optimum (e.g., 3D) state in an installation environment of the home theater system (block 21) or periodically. The user can transmit the key signal by using a remote controller, an input device, etc.

The main controller 20 judges whether the received key signal is the audio output adjusting signal (block 22). When the inputted key signal is the audio output adjusting key signal (block 22), a function for adjusting the audio signal output can be performed. The main controller 20 can output the predetermined test audio signal to the speakers 31, 32, 33, 34, 35, and 36 when the inputted key signal is the audio output adjusting key signal (block 23). The test audio signal preferably indicates an audio signal having a predetermined output level in order to adjust an audio output of the home theater system. For example, volume levels and timings of the test audio signal can be set before the home theater system is presented for sale.

The speakers 31, 32, 33, 34, 35, and 36 sequentially and/or in combination can output the test audio signal received from the main controller 20 having the predetermined volume level and output timing to the checker 10 (block 25). For example, the main controller 20 can set an output timing order of the test audio signal in the order of the speakers forming the theater system such as a center speaker 31, a front left speaker 34, a front right speaker 33, a rear left speaker 36, a rear right speaker 35, and a woofer speaker 32.

The checker 10 can analyze volume and delay time of an audio signal inputted from the speakers 31, 32, 33, 34, 35, and 36 and output the analyzed information to the main controller 20 (block 26). The main controller 20 receives the analyzed information of the checker 10, and the main controller 20 can adjust output level and timing outputted from the speakers 31, 32, 33, 34, 35, and 36 to be suitable for an installation space of the speakers on the basis of the analyzed information (block 27).

When the main controller 20 judges the inputted key signal is not the audio output adjusting key signal (block 22) the main controller 20 can perform a function corresponding to the inputted key signal (block 24). Therefore, the user can appreciate audio of the home theater system as a desired three-dimensional sound or an optimum state even if an installation place of the home theater system is changed. After blocks 27 and 24, the process can end.

Figure 3:
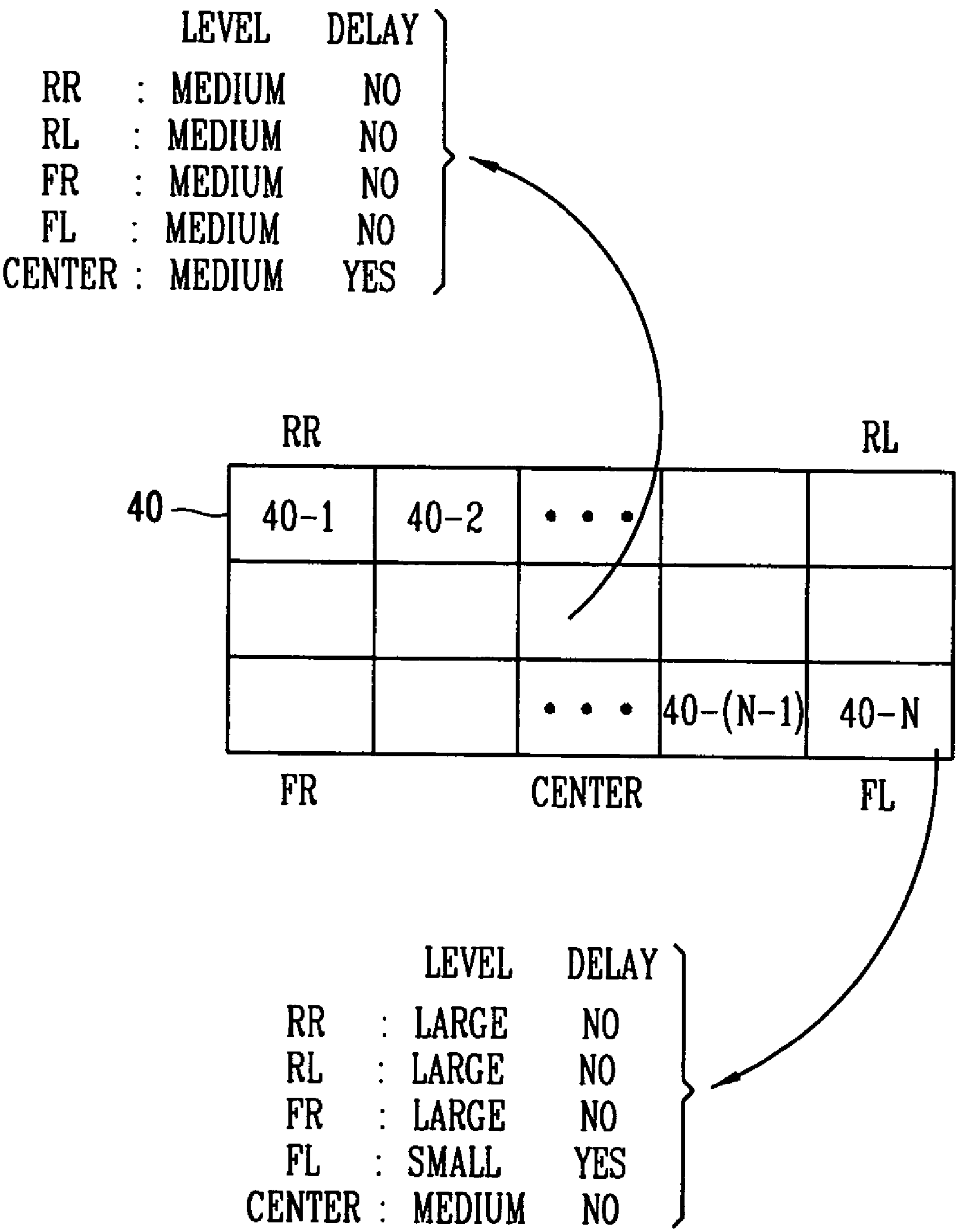
FIG. 3 is a diagram showing an exemplary configuration of locating a prescribed audio state within a selected region.

FIG. 3 is a diagram showing another embodiment of an audio output adjusting device of a home theater system according to the present invention. As shown in FIG. 3, an audio output adjusting device of a home theater system according to the embodiment can include speakers (e.g., located at a user's periphery), a checker and a main controller (not shown). The embodiment of the audio output adjusting device of FIG. 3 can be applied to and will be described using the system shown in FIG. 1. However, the present invention is not intended to be so limited.

As shown in FIG. 3, a grid 40 or the like can be determined with a prescribed relationship to the speakers (e.g., speakers 31, 33, 34, 35 and 36). As shown in FIG. 3, the grid 40 has a prescribed configuration (e.g., rectangular) including a plurality of grid units (40-1, . . . 40-2) (e.g., square) having a matrix form. However, the present invention is not intended to be so limited. For example, the grid units (40-1, . . . 40-2) could have a different shape such as a rectangle, a circle, an asymmetrical shape or the like or a combination of shapes. Further, the grid configuration could be different including an asymmetrical shape such as corresponding to open area of a room.

The grid units (40-1, . . . , 40-_n_) forming the grid 40 can have predefined characteristics stored, for example, in memory 60 in FIG. 1, for each of the plurality of speakers so that the prescribed audio sound or optimum sound in generated at a corresponding grid unit when the corresponding predefined characteristics are used by the audio output adjusting device. For example, as shown in FIG. 3, the predefined characteristics can include a level and delay for each of the speakers. However, the present invention is not intended to be so limited as other or additional control variables for the speaker output can be used. Exemplary values for the predefined characteristics are shown for two of the grid units (40-1, . . . , 40-_n_) in FIG. 3. Further, the woofer speaker 32 can also be included.

Operations of the audio output adjusting device of a home theater system of FIG. 3 will now be explained. The speakers 31, 33, 34, 35, and 36 can output a test audio signal to the checker 10. The checker 10 can analyze at least volume and delay time of the inputted test audio signal and can output the analyzed information to the main controller 20. For example, the checker 10 can include a microphone that receives the output test signal. The checker 10 can then compare the received test signal to the stored predefined characteristics to determine in which grid unit 40-1, 40-2, . . . , 40-_n_ it is currently positioned. Analyzed information corresponding to the determined grid unit can then be output by the checker 10. Then, the main controller 20 can adjust output level and timing of an audio signal outputted from the speakers 31, 33, 34, 35, and 36 on the basis of the analyzed information. In other words, the main controller 20 could store audio output control requirements for each of the plurality of grid units (40-1, . . . 40-2) or a plurality of preset or user defined grids 40. Alternatively, the checker 10 could output the raw data or results of received test signal to the main controller 20 for analysis.

Figure 4:
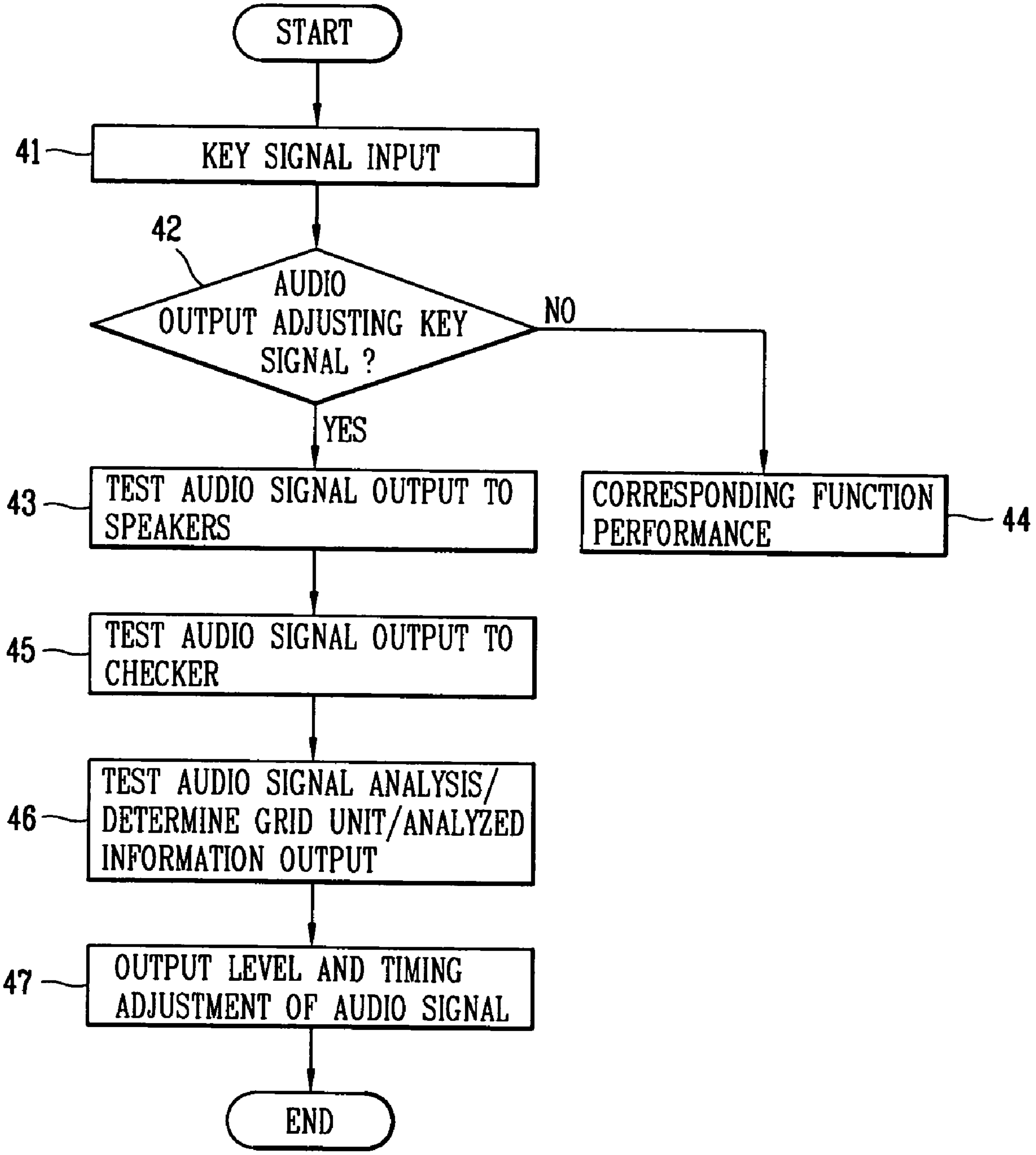
FIG. 4 is a flowchart showing another preferred embodiment of an audio output adjusting method of a home theater system according to the present invention.

FIG. 4 is a flow chart showing another embodiment of an audio output adjusting method of audio output adjusting method of a home theater system according to the present invention. The embodiment of an audio output adjusting method of FIG. 4 can be applied to and will be described using the system shown in FIG. 1. However, the present invention is not intended to be so limited.

As shown in FIG. 4, after a process starts, the user can output an audio output adjusting key signal to the main controller 20 to analyze an audio state in an installation environment of the home theater system (block 41). The user can transmit the key signal by using a remote controller, an input device, etc.

The main controller 20 judges whether the received key signal is the audio output adjusting signal (block 42). When the inputted key signal is the audio output adjusting key signal (block 42) the audio signal output can be adjusted. The main controller 20 can output the predetermined test audio signal to the speakers 31, 33, 34, 35, and 36 when the inputted key signal is the audio output adjusting key signal (block 43). The test audio signal preferably indicates an audio signal having a predetermined output level in order to analyze and adjust an audio output of the home theater system. Volume levels and timings, etc. of the test audio signal can be preset.

The speakers 31, 33, 34, 35, and 36 sequentially and/or in combination can output the test audio signal received from the main controller 20 to the checker 10 by the predetermined volume level and output timing of the audio signal (block 45). For example, the main controller 20 can set an output timing order of the test audio signal in the order of the speakers forming the theater system such as a center speaker 31, a front left speaker 33, a front right speaker 34, a rear left speaker 35, a rear right speaker 36 and/or a woofer speaker 32.

The checker 10 can analyze volume and delay time of an audio signal inputted from the speakers 31, 33, 34, 35, and 36, determine a grid unit containing the checker 10 and output the analyzed information to the main controller 20 (block 46). For example, the checker can include a microphone that records the received test signal. Then, the speaker output can be compared to a reference signal and a difference (or similar combinations/comparisons) can be determined. The difference can be output to the main controller as the analyzed information. The main controller 20 receives the analyzed information of the checker 10, and the main controller 20 can determine which of the grid units 40-1, 40-2, . . . , 40-_n_ the checker 10 is located (block 46). Alternatively, the checker 10 could determine the grid unit containing the checker 10 and output the identified grid and/or its corresponding predefined characteristics. Then, the main controller 20 can adjust output level and timing outputted from the speakers 31, 33, 34, 35, and 36 according to the predefined characteristics of the identified or selected grid unit 40-1, 40-2, . . . , 40-_n_ (block 47). Therefore, the user can appreciate audio of the home theater system as a desired three-dimensional sound or an optimum state even if a location of a user, configuration of the speakers (e.g., 31, 32, 33, 34, 35 and 36) and/or an installation place of the home theater system is changed.

When the main controller 20 judges the inputted key signal is not the audio output adjusting key signal (block 42) the main controller 20 can perform a function corresponding to the inputted key signal (block 44). After blocks 47 and 44, the process can end.

As described above, embodiments of a home theater system, home theater system audio adjusting device and methods thereof have various advantages. In embodiments of the audio output adjusting device of a home theater system and methods thereof, the user can appreciate audio of the home theater system in a prescribed audio configuration state even if an installation place of the home theater system is changed by controlling output level and timing of an audio signal outputted from the speakers.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An audio output adjusting device of a home theater system, comprising:

a memory storing predetermined control information for each of a plurality of locations arranged in a grid pattern defined within a listening area, said control information indicating an output level and timing of audio signals to be output from each of a plurality of speakers of the home theater system;

a checker that is configured to detect a volume and a delay time of a test audio signal that is simultaneously outputted from a combination of speakers and that determines its location on the grid pattern based on the detected test audio signal; and a controller configured to control an output level and a timing of subsequent audio signals outputted from the speakers based on the predetermined control information stored for the location on the grid pattern where the checker is located.

2. The device of claim 1, wherein the speakers include a center speaker, a woofer speaker, a front left speaker, a front right speaker, a rear left speaker, and a rear right speaker.

3. The device of claim 1, wherein the checker is installed in a remote controller configured to control the home theater system.

4. The device of claim 1, wherein the volume level and output timing of the test audio signal are preset.

5. The device of claim 1, wherein the checker is configured to perform the analysis and output analyzed information to the controller.

6. The device of claim 1, wherein the checker transmits a signal to the controller requesting output of the test audio signal.

7. The device of claim 1, wherein a position of the checker relative to the speakers is changed.

8. The device of claim 1, wherein the analysis determines a positional relationship between a prescribed location and each of the speakers, wherein the controller performs the analysis.

9. The device of claim 1, wherein at least one of the checker and the controller compare a volume and delay time of the received test audio signal to the predetermined control information and determine the location within the grid which most closely corresponds to the volume and delay time of the received test audio signal.

10. An audio output adjusting method of a home theater system, comprising:

simultaneously outputting a test audio signal from a combination of speakers according to a request;

analyzing a volume level and a timing of the outputted test audio signal, wherein the analyzing step comprises:

receiving the transmitted test audio signal with a checker;

establishing a grid pattern between the speakers; and comparing reference characteristics for a plurality of locations on the grid pattern to characteristics of the transmitted test audio signal received by the checker; and determining a location on the grid containing the checker based on the comparison; and controlling an output level and a timing of subsequent audio signals outputted from the speakers based on the analyzed information.

11. The method of claim 10, wherein the volume level and the timing of the test audio signal are preset.

12. The method of claim 10, wherein the outputted test audio signal is received by the checker and then transmitted to a controller.

13. The method of claim 12, wherein the checker is incorporated into a remote control device of the home theater system.

14. The method of claim 10, wherein the analyzed information determines a positional relationship between a prescribed location and at least three speakers.

15. The method of claim 10, wherein the analyzing comprises one of a checker performing the analysis to output the analyzed information to the controller and the controller performing the analysis to determine the analyzed information.

16. The method of claim 10, wherein the controlling step comprises adjusting the subsequent audio signals based on prescribed characteristics corresponding to the determined location on the grid to establish a prescribed audio state for that location in the grid.

17. An audio output adjusting method for a home entertainment system that includes a plurality of output audio devices, comprising:

storing predetermined control information in the home entertainment system for each of a plurality of locations arranged in a grid pattern defined within a listening area, said control information indicating an output level and timing of audio signals to be output from each of the output audio devices;

transmitting a prescribed test signal simultaneously from a plurality of the output audio devices of the home entertainment system;

receiving the prescribed test signal at a particular location within the listening area of the home entertainment system;

analyzing the received prescribed test signal transmitted by the output audio devices; and modifying the control of the audio signals to be subsequently output by the output audio devices according to the analyzed prescribed test signal to establish a prescribed audio state at the particular location, wherein control of the audio signals includes modifying an output level and a timing of the audio signals subsequently output from one or more of the output audio devices based on the predetermined control information stored for the particular location at which the prescribed test signal was received.

18. The method of claim 17, wherein the modifying the control of subsequent audio signals to be output is based on volume and timing of the prescribed test signal received at the particular location.

19. The method of claim 17, where in the prescribed audio state is a three-dimensional sound at the particular location.

20. The method of claim 17, wherein the analyzing step comprises:

receiving the transmitted prescribed test signal with a checker;

comparing reference characteristics for a plurality of locations within the grid pattern and the transmitted prescribed test signal received by the checker; and determining a location within the grid pattern that contains the checker based on the comparison.

21. The method of claim 20, wherein the modifying step comprises adjusting the subsequent output audio signals to establish the prescribed audio state in the location that contains the checker.

22. A home audio system, comprising:

a controller;

a plurality of speakers coupled to the controller;

a memory that stores a plurality of sets of control information for a corresponding plurality of locations within a listening area of the home theater system, wherein each set of control information indicates an output level and timing information for each of the speakers;

a checker that receives a test audio signal output from the speakers, wherein at least one of the checker and the controller determine at which of the plurality of locations within the listening area the checker is located based on an analysis of the received test audio signal, and wherein the controller controls the speakers based on the set of control information corresponding to the determined location of the checker which is stored in the memory.

23. A method of controlling a home audio system having a plurality of speakers, comprising:

receiving a test audio signal output from the plurality of speakers with a checker;

comparing audio characteristics of the test audio signal received by the checker to a plurality of predetermined sets of test audio characteristics that correspond to the different locations within the listening area to determine which of the predetermined sets of test audio characteristics most closely match the audio characteristics of the test audio signal received by the checker; and determining that the checker is at the location corresponding to the predetermined set of test audio characteristics that most closely match the audio characteristics of the test signal received by the checker; and subsequently controlling the volume and timing of the audio output from each of the speakers based on a predetermined set of audio characteristics that correspond to the location of the checker.

* * * * *